(12) United States Patent
Kang et al.

(10) Patent No.: US 6,372,598 B2
(45) Date of Patent: *Apr. 16, 2002

(54) METHOD OF FORMING SELECTIVE METAL LAYER AND METHOD OF FORMING CAPACITOR AND FILLING CONTACT HOLE USING THE SAME

(75) Inventors: Sang-bum Kang; Yun-sook Chae, both of Seoul; Sang-in Lee, Suwon; Hyun-seok Lim, Yongin; Mee-young Yoon, Seongnam, all of (KR)

(73) Assignee: Samsung Electronics Co., Ltd. (KR)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/334,588

(22) Filed: Jun. 16, 1999

(30) Foreign Application Priority Data

Jun. 16, 1998 (KR) .......................................... 98-022579
May 14, 1999 (KR) ............................................. 99-17362

(51) Int. Cl.$^7$ .............................................. H01L 21/20
(52) U.S. Cl. ........................ 438/399; 438/618; 427/253
(58) Field of Search .................... 438/399, 641, 438/648, 674, 675, 694, 677, 679, 680, 685, 686, 398, 695; 427/253, 455, 456, 585, 124, 99, 255.7

(56) References Cited

U.S. PATENT DOCUMENTS 5,358,901 A * 10/1994 Fiordalice et al. .......... 437/192
5,622,888 A    4/1997 Sekine et al. ............... 398/438

FOREIGN PATENT DOCUMENTS

| JP | 60-113928 | 6/1985 |
| JP | 63-140525 | 6/1988 |
| JP | 2-304928 | 12/1990 |
| KR | 2000-26932 | 3/2001 |

* cited by examiner

Primary Examiner—Olik Chaudhuri
Assistant Examiner—Ginette Peralta
(74) Attorney, Agent, or Firm—Marger Johnson & McCollom, P.C.

(57) ABSTRACT

A selective metal layer formation method, a capacitor formation method using the same, and a method of forming an ohmic layer on a contact hole and filling the contact hole using the same, are provided. A sacrificial metal layer is selectively deposited on a conductive layer by supplying a sacrificial metal source gas which deposits selectively on a semiconductor substrate having an insulating film and the conductive layer. Sacrificial metal atoms and a halide are formed, and the sacrificial metal layer is replaced with a deposition metal layer such as titanium Ti or platinum Pt, by supplying a metal halide gas having a halogen coherence smaller than the halogen coherence of the metal atoms in the sacrificial metal layer. If such a process is used to form a capacitor lower electrode or form an ohmic layer on the bottom of a contact hole, a metal layer can be selectively formed at a temperature of 500° C. or lower.

32 Claims, 12 Drawing Sheets

METHOD OF FORMING SELECTIVE METAL LAYER AND METHOD OF FORMING CAPACITOR AND FILLING CONTACT HOLE USING THE SAME

BACKGROUND OF THE INVENTION

1. Field of the Invention

The present invention relates to a method of manufacturing semiconductor devices, and more particularly, to a method of forming a selective metal layer and methods of forming a capacitor of a semiconductor device and filling a contact hole using the same.

2. Description of the Related Art

As semiconductor devices become highly integrated and complicated, a metal layer must often be selectively formed while manufacturing the semiconductor devices. In a process for manufacturing a capacitor of a semiconductor device, a lower electrode is formed using a metal instead of polysilicon to obtain high capacitance, thereby achieving a metal insulator silicon (MIS) or metal insulator metal (MIM) structure. Or, in a process for filling a contact hole, an ohmic layer is formed on the bottom of a small contact hole having a high aspect ratio. The above two processes have many difficulties.

In the manufacturing process of the capacitor having the metallic lower electrode, it is very difficult to selectively deposit a metal layer without patterning the metal layer on a hemispherical grain (HSG) polysilicon lower electrode. At present, such technology is not known at all. Also, in order to use $PZT(Pb(Zr,Ti)O_3)$ or $BST((Ba,Sr)TiO_3)$, having a Perovskite structure, as a high dielectric film of a capacitor, it is preferable that platinum (Pt), which is not oxidized and has excellent leakage current properties, is used instead of an existing polysilicon electrode, when a dielectric film is deposited. However, when a metal layer such as a platinum film is deposited by a blanket method rather than a selective method, etching is hard. That is, when the platinum film formed by the blanket method is dry-etched using chlorine ($Cl_2$) gas as an etchant, PtClx generated as a by-product of etching is a non-volatile conductive polymer. Thus, a process for removing the PtClx by wet etching must also be performed. In the wet etching process, to remove PtClx, part of a platinum lower electrode is also etched. It is therefore difficult to perform a repeatable process in a manufacturing process of a dynamic random access memory (DRAM) which requires fine patterning.

Also, the ohmic layer is formed on the bottom of the contact hole by depositing a highly conductive metal having a high melting point, such as titanium, by plasma enhanced chemical vapor deposition (PECVD) or sputtering. However, when sputtering is used to form the ohmic layer, step coverage is low. The PECVD is not suitable to apply to an actual process, since leakage current is increased by a high deposition temperature of 600° C. or more and thus the electrical characteristics of the semiconductor devices are deteriorated.

In addition, if the ohmic layer such as a titanium (Ti) layer is formed by sputtering, and a barrier layer, e.g., a titanium nitride (TiN) layer, is formed on the ohmic layer by chemical vapor deposition (CVD), the ohmic layer may be corroded and the interface between the ohmic layer and the barrier layer may lift. If the barrier layer (TiN) is formed on a titanium (Ti) ohmic layer by sputtering, the interface between the ohmic layer and the barrier layer does not lift. However, when a plug layer for filling the contact is formed using tungsten by CVD in a subsequent process, the lifting problem occurs.

Therefore, a method is required of selectively forming a metal layer at a temperature of 500° C. or lower where the electrical characteristics of semiconductor devices are not degraded. However, at present, it is very difficult to realize such a technique in the process of forming the lower electrode of the capacotor and forming the ohmic layer of the contact hole.

SUMMARY OF THE INVENTION

To solve the above problems, it is an objective of the present invention to provide a method of forming a selective metal layer, by which a sacrificial metal layer is selectively deposited at a temperature of 500° C. or lower. The sacrificial metal layer is replaced with a deposition metal layer by reacting the sacrificial metal layer with a metal halide gas having a smaller halogen coherence than a metallic atom of the sacrificial metal layer.

It is another objective of the present invention to provide a method of forming a capacitor of a semiconductor device using the selective metal layer formation method.

It is still another objective of the present invention to provide a method of filling a contact hole using the selective metal layer formation method.

Accordingly, to achieve the first objective, in a selective metal layer formation method, a semiconductor substrate on which an insulating film and a conductive layer are formed is loaded into a chamber, and a purge gas, e.g. a mixture of hydrogen and silane, is supplied to the chamber. A sacrificial metal layer is formed on only the conductive layer by supplying to the chamber a sacrificial metal source gas which is deposited selectively on the conductive layer. The sacrificial metal source gas is preferably either dimethyl aluminum hydride (DMAH: $(CH_3)_2AlH$) or dimethyl ethylamine alane (DMEAA: $(CH_3)_2C_2H_5N{:}AlH_3$). Finally, the sacrificial metal layer is replaced with a deposition metal layer by supplying to the chamber a metal halide gas having a halogen coherence smaller than the halogen coherence of metal atoms in the sacrificial metal layer.

According to a preferred embodiment of the present invention, the purge gas is continuously supplied, or first supplied in a predetermined amount to purge and periodically supplied in predetermined amounts after the sacrificial metal layer is formed and replaced with the deposition metal layer. Here, it is suitable that the supply time and amount of a purge gas to be supplied after replacement of the deposition metal layer are greater than in other steps.

It is suitable that the insulating film is an oxide film ($SiO_2$) or a complex film including the oxide film, and that the conductive layer is formed of silicon doped with impurities, or a metal containing material.

Preferably, the metal containing material for the conductive layer is a refractory metal, a refractory metal nitride, a refractory metal carbide, a metal silicide, conductive Perovskite, a platinum-family metal, a conductive platinum-family nitride, or a mixture of two or more of the above materials. It is preferable that $TiCl_4$ is used as the metal halide gas when the deposited metal is titanium. Also, it is preferable that a gas obtained by dissolving platinic chloride ($Cl_6H_6Pt$) or $PtCl_2$ in water ($H_2O$) or alcohol and vaporizing the dissolved $Cl_6H_6Pt$ or $PtCl_2$ is used as the metal halide gas when the deposited metal is platinum.

To achieve the second objective, in a method of forming a capacitor of a semiconductor device using a selective metal layer formation method, a contact hole exposing a source region of a semiconductor substrate is formed, by forming an insulating film such as an oxide film ($SiO_2$) or a complex film including the oxide film on the semiconductor substrate and patterning the insulating film. A conductive layer is formed of polysilicon doped with impurities, or a metal containing material, filling the contact hole and covering the insulating film. A conductive layer pattern connected to the contact hole is formed by patterning or chemically mechanically polishing the conductive layer. The semiconductor substrate is introduced into a chamber, and a purge gas of hydrogen ($H_2$) and silane ($SiH_4$), is supplied to the chamber. A sacrificial metal layer is formed on only the conductive layer, by supplying to the chamber a sacrificial metal source gas which is deposited selectively on the conductive layer. Here, the sacrificial metal source gas is preferably either dimethyl aluminum hydride (DMAH: $(CH_3)_2ALH$) or dimethyl ethylamine alane (DMEAA: $(CH_3)_2C_2H_5N:AlH_3$). Then, the sacrificial metal layer is replaced with a deposition metal layer by supplying to the chamber a metal halide gas having a halogen coherence smaller than the halogen coherence of metal atoms in the sacrificial metal layer. Finally, a dielectric film is formed on the deposition metal layer, and an upper electrode is formed on the dielectric film.

According to a preferred embodiment of the present invention, the step of forming a hemispherical grain on the surface of a conductive pattern can be performed after the conductive layer pattern is formed.

It is preferable that the purge gas is continuously supplied, or first supplied in a predetermined amount to purge and periodically supplied in predetermined amounts after the sacrificial metal layer is formed and after the sacrificial metal layer is replaced with the deposition metal layer. Here, it is proper that a purge gas supplied after the deposition metal layer is replaced has a longer supply time and greater amount of supply than a purge gas supplied in other steps.

Also, according to the preferred embodiment of the present invention, the step of siliciding the deposition metal layer can be further comprised after the step of forming the deposition metal layer.

To achieve the third objective, in a method of filling a contact hole using a selective metal layer formation method, an insulating film, such as an oxide film ($SiO_2$) or a complex film including the oxide film, is formed on a semiconductor substrate. A contact hole exposing a lower film of polysilicon doped with impurities, or a metal such as TiN, is formed by patterning the insulating film. The semiconductor substrate on which the contact hole is formed is introduced into a chamber, and a purge gas, preferably a mixture of hydrogen ($H_2$) and silane ($SiH_4$), is supplied to the chamber. A sacrificial metal layer is formed of aluminum (Al) on only the lower film by supplying to the chamber a sacrificial metal source gas which is deposited selectively on the lower film. Here, the sacrificial metal source gas is either dimethyl aluminum hydride (DMAH: $(CH_3)_2ALH$) or dimethyl ethylamine alane (DMEAA: $(CH_3)_2C_2H_5N:AlH_3$). Then, the sacrificial metal layer is replaced with a deposition metal layer by supplying a metal halide gas having a halogen coherence smaller than the halogen coherence of metal atoms in the sacrificial metal layer, to the chamber. Finally, a conductive layer filling the contact hole is formed.

According to the preferred embodiment of the present invention, the purge gas is continuously supplied, or first supplied in a predetermined amount to purge and periodically supplied in predetermined amounts after the sacrificial metal layer is formed and after the sacrificial metal layer is replaced with the deposition metal layer. Here, it is proper that a purge gas supplied after the deposited metal layer is replaced has a longer supply time and greater amount of supply than a purge gas supplied in other steps.

Also, it is preferable to form a barrier layer, e.g., a TiN layer, on a deposition metal layer after the step of replacing the sacrificial metal layer with the deposition metal layer.

According to the present invention, in a process for manufacturing semiconductor devices, a specific metal selectively formed at a temperature of 500° C. or lower is applied to the process for forming a lower electrode of a capacitor, thereby forming a metallic lower electrode of a capacitor without serious process difficulty. Also, when the ohmic layer is formed on the bottom surface of the contact hole, property degradation or lifting of a thin film due to corrosion can be prevented, while simultaneously increasing step coverage.

BRIEF DESCRIPTION OF THE DRAWINGS

The above objectives and advantages of the present invention will become more apparent by describing in detail preferred embodiments thereof with reference to the attached drawings in which.

DESCRIPTION OF THE PREFERRED EMBODIMENTS

Method of Forming a Selective Metal Layer

Figure 1:
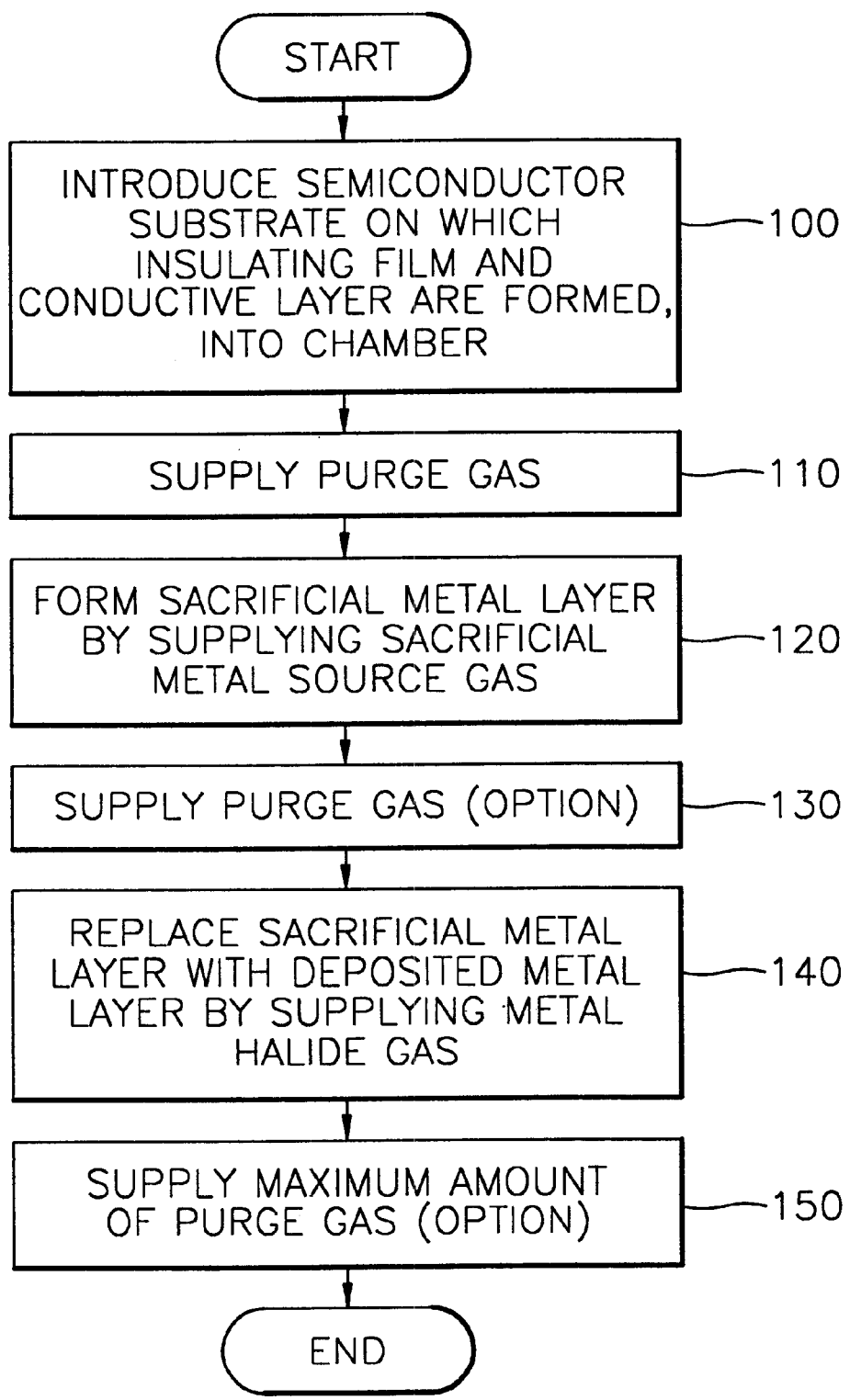
FIG. 1 is a flowchart illustrating a process for forming a selective metal layer, according to the present invention.

Referring to FIG. 1 illustrating a process for forming a selective metal layer, according to the present invention, first, a semiconductor substrate on which an insulating film and a conductive layer are formed is introduced into a chamber of a semiconductor manufacturing device, in step 100. Here, the insulating film is an oxide film ($SiO_2$) which does not absorb a metal deposited to form a selective metal layer, or a complex film including the oxide film. The conductive layer is formed of polysilicon doped with impurities having hydrogen termination radical, on which aluminum Al can be easily and selectively deposited. Alternatively, the conductive layer is formed of a refractory metal, a refractory metal nitride, a refractory metal carbide, a metal silicide, conductive Perovskite, a platinum-family metal, a conductive platinum-family oxide, or a mixture of two or more of the above materials. The platinum-family metal can be Pt, Rh, Ru, Ir, Os or Pd, the conductive platinum family oxide can be PtOx, RhOx, RuOx, IrOx, OsOx or PdOx, and the conductive Perovskite can be $CaRuO_3$, $SrRuO_3$, $BaRuO_3$, $(BaSr)RuO_3$, $CaIrO_3$, $SrIrO_3$, $BaIrO_3$, or $(La, Sr)CoO_3$. Next, a purge gas such as hydrogen $H_2$, silane $SiH_4$, nitrogen, argon, or a mixture of two or more of the above gases is supplied to the chamber to purge the inside of the chamber, in step 110. Here, the purge gas can be supplied by the following two methods. First, the purge gas can be continuously supplied in a predetermined amount from the beginning. Second, a predetermined mount of purge gas is supplied to the chamber after supplying a sacrificial metal source gas or a metal halide gas, to purge the chamber, and a predetermined amount of purge gas can be periodically supplied after the steps 120 of depositing a sacrificial metal and after the step 140 of replacing the sacrificial metal layer with a deposition metal layer.

A sacrificial metal layer made of aluminum (Al) is formed on the surface of the conductive layer by supplying to the chamber dimethyl aluminum hydride (DMAH: $(CH_3)_2AlH$) or dimethyl ethylamine alane (DMEAA: $(CH_3)_2C_2H_5N{:}AlH_3$) as a sacrificial metal source gas, in step 120. The sacrificial metal layer is made of aluminum because aluminum will readily combine with a halogen-family element such as Cl, Br, F or I with the highest Gibbs free energy. Moreover, various precursors for aluminum have already been developed. At the same time, Al halides have Gibbs free values that facilitates ready replacement of the Al metal layer as further described below. Precursors for the deposition of aluminum include di-i-butylaluminum hydride $((C_4H_9)_2AlH)$, tri-i-butylauminum $((C_4H_9)_3Al)$, tri-ethylanuminum $((C_2H_5)_2Al)$, trimethylaluminum $((CH_3)_3Al)$, trimethylamine $(AlH_3N(CH_3)_3)$, dimethyl aluminum hydride $((CH_3)_2AlH)$, and dimethyl ethylamine alane $((CH_3)_2C_2H_5N{:}AlH_3)$. The dimethyl aluminum hydride $((CH_3)_2AlH)$ (hereinafter called 'DMAH') and dimethyl ethylamine alane $((CH_3)_2C_2H_5N{:}AlH_3)$ (hereinafter called 'DMEAA') are not deposited on an insulating film such as the oxide film ($SiO_2$) but they are deposited selectively on only a metal such as TiN or silicon which is doped with the impurities of hydrogen ($H_2$) termination radical. That is, the DMAH and DMEAA are deposited not on the insulating film of the semiconductor substrate in the chamber but selectively on only the conductive layer.

Then, a purge gas is supplied to the chamber having the semiconductor substrate on which the sacrificial metal layer is selectively formed, to purge the sacrificial metal source gas from the chamber, in step 130.

Next, $TiCl_4$ is introduced into the chamber in step 140. The $TiCl_4$ is decomposed and the Ti replaces the Al sacrificial layer to form a metal layer of Ti. Here, the metal in the metal halide gas has a weaker halogen coherence than a metal atom of the sacrificial metal layer, so that the metal atom of the sacrificial metal layer reacts with the metal halide gas. That is, the Gibbs free energy of $TiCl_4$ is 678.3 kJ/mol at 427° C. (700K), which is higher than that of most metal halides, whereas the Gibbs free energy of $AlCl_6$ is 1121.9 kJ/mol which is higher than that of $TiCl_4$, so that the metal atoms of the sacrificial metal layer react with the metal halide gas. Thus, aluminum atoms of the sacrificial metal layer are separated from the surface of the conductive layer and react with a chlorine (Cl) gas having a higher coherence, thus becoming $AlCl_x$ of a gaseous state. Also, titanium (Ti) resolved from $TiCl_4$ is deposited in the empty places where the aluminum atoms separate from the surface of the conductive layer. When the metal halide gas having a smaller Gibbs free energy, i.e., the coherence between a sacrificial metal and the halogen atom, is supplied into the chamber having the semiconductor substrate on which the sacrificial metal is formed, a metal layer can be selectively formed. The deposition metal layer formed as described above can use titanium, tantalum, zirconium, hafnium, cobalt, molybdenum, tungsten, nickel or platinum.

Here, when the deposited metal is titanium, $TiCl_4$ is used as the metal halide gas, and when the deposited metal is platinum, a gas obtained by melting and vaporizing platinic chloride ($Cl_6H_6Pt$) or $PtCl_2$ in water ($H_2O$) or alcohol is used as the metal halide gas. Also, when the deposited metal is cobalt, either cobalt chloride $CoCl_2$, cobalt fluoride $CoF_2$, or cobalt iodide $CoI_2$ is used as the metal halide gas. Here, since platinic chloride ($Cl_6H_6Pt$) or $PtCl_2$, which is a metal halide containing platinum, is solid, it must be used after being melted in a solvent and vaporized. Since platinum is inert compared with other metals, it has a lower coherence with the halogen atom. Accordingly, when the platinum reacts with the sacrificial metal layer such as aluminum, it can be easily deposited.

When the deposited metal is molybdenum, either bis(cyclopentadienyl)molybdenum dichloride $(C_5H_5)_2MoCl_2$, cyclopentadienylmolybdenum tetrachloride $C_5H_5MoCl_4$, molybdenum $MoF_6$, molybdenum fluoride $MoCl_3/MoCl_5$, or molybdenum iodide $MoI_2$ is used as the metal halide gas. When the deposited metal is nickel, either $[(C_6H_5)_2PCH_2CH_2CH_2P(C_6H_5)_2]NiCl_2$ (1,2-bis(diphenylphosphineo)propane nickel), $[(C_6H_5)_5C_5]_2NiBr_2$ (bis(triphenylphosphin)nickel bromide), $[(C_6H_5)_3P]_2NiCl_2$ (bis(triphenylphosphin)nickel chloride), $[Ni(NH_3)_6]Cl_2$ (hexaaminenickel chloride), $[Ni(NH_3)_6]I_2$ (Hexaamine iodide), $NiBr/NiBr_2$ (nickel bromide), $NiCl_2$ (nickel chloride), $NiF_2$ (nickel fluoride), or $NiI_2$ (nickel iodide) is used as the metal halide gas. When the deposited metal is tungsten, either bis(cyclopentadienyl)tungsten dichloride $(C_5H_5)_2WCl_2$, tungsten bromide $WB/W_2B/W_2B_5$, tungsten chloride $WCl_4/WCl_6$, or tungsten fluoride $WF_6$ is used as the metal halide gas.

For reference, Tables 1 through 5 show the Gibbs free energies of many metal halide gases at an absolute temperature of 700K(427° C.).

TABLE 1

The Gibbs free energies of gaseous compounds containing Cl at 427° C.

| compound | gibbs free energy (kJ/mol) |
|---|---|
| $Al_2Cl_6$ | −1121.9 |
| $ThCl_4$ | −895.8 |
| $UCl_5$ | −811.9 |
| $HfCL_4$ | −804.7 |
| $ZrCl_4$ | −777.6 |
| $LaCl_3$ | −708.9 |
| $PrCl_3$ | −706.9 |
| $In_2Cl_6$ | −703.7 |
| $CeCl_3$ | −699.5 |
| $NdCl_3$ | −696.6 |
| $Be_2Cl_4$ | −692.6 |
| $TiCl_4$ | −678.3 |
| $GdCl_3$ | −674.3 |
| $TbCl_3$ | −668.1 |
| $HoCl_3$ | −659.7 |
| $ErCl_3$ | −651.7 |
| $Cs_2Cl_2$ | −644.1 |

TABLE 1-continued

The Gibbs free energies of gaseous compounds containing Cl at 427° C.

| compound | gibbs free energy (kJ/mol) |
|---|---|
| $TmCl_3$ | −641.5 |
| $TaCl_5$ | −636.6 |
| $HfCl_3$ | −626.7 |
| $EuCl_3$ | −621.6 |
| $YbCl_3$ | −621.5 |
| $K_2Cl_2$ | −609.8 |
| $Rb_2Cl_2$ | −607.6 |
| $Li_2Cl_2$ | −597.8 |
| $SiCl_4$ | −569.6 |
| $AlCl_3$ | −550.1 |
| $Fe_2Cl_6$ | −526.8 |
| $BaCl_2$ | −524.3 |
| $SrCl_2$ | −498.1 |
| $TaCl_4$ | −497.5 |
| $CaCl_2$ | −489.1 |
| $PbCl_4$ | −462.1 |
| $VaCl_4$ | −447.2 |
| $GeCl_4$ | −410.8 |
| $MgCl_2$ | −407.8 |
| $Fe_2Cl_4$ | −406.5 |
| $GaCl_3$ | −388.6 |
| $BeCl_2$ | −373.1 |
| $BCl_3$ | −367.7 |
| $SiCl_3$ | −365.7 |
| $SnCl_4$ | −362.3 |
| $InCl_3$ | −335.8 |
| $AlCl_2$ | −305.5 |
| $TaCl_3$ | −300.1 |
| $GeCl_3$ | −299.8 |
| $MnCl_2$ | −286.4 |
| $WCl_5$ | −285.6 |
| $CSCl$ | −276.7 |
| $ZnCl_2$ | −273.5 |
| $WCl_4$ | −267.6 |
| $Ti_2Cl_2$ | −259.8 |
| $GaCl_2$ | −258.4 |
| $SbCl_5$ | −249.9 |
| $Cu_3Cl_3$ | −242.9 |
| $PCl_3$ | −242.3 |
| $FeCl_3$ | −240.6 |

TABLE 2

The Gibbs free energies of gaseous compounds containing iodine I at 427° C.

| compound | gibbs free energy (kJ/mol) |
|---|---|
| $ThI_4$ | −512 |
| $Al_2I_6$ | −510 |
| $K_2I_2$ | −480 |
| $LaI_3$ | −457 |
| $PrI_3$ | −448 |
| $CeI_3$ | −442 |
| $NdI_3$ | −438 |
| $Li_2I_2$ | −427 |
| $ErI_3$ | −410 |
| $ZrI_4$ | −409 |
| $HfI_4$ | −405 |
| $DyI_3$ | −402 |
| $TmI_3$ | −399 |
| $GdI_3$ | −388 |
| $BaI_2$ | −380 |
| $UI_4$ | −377 |
| $SrI_2$ | −353 |
| $CaI_2$ | −338 |
| $TiI_4$ | −320 |
| $PbI_4$ | −266 |
| $MgI_2$ | −239 |
| $CuI$ | −237 |

TABLE 2-continued

The Gibbs free energies of gaseous compounds containing iodine I at 427° C.

| compound | gibbs free energy (kJ/mol) |
|---|---|
| $CsI$ | −220 |
| $TaI_5$ | −202 |
| $SiI_4$ | −150 |
| $HI$ | −11.8 |

TABLE 3

The Gibbs free energies of gaseous compounds containing bromine (Br) at 427° C.

| compound | gibbs free energy (kJ/mol) |
|---|---|
| $Al_2Br_6$ | −860 |
| $Mg_2Br_4$ | −764 |
| $ThBr_4$ | −743 |
| $HfBr_4$ | −639 |
| $ZrBr_4$ | −627 |
| $LaBr_3$ | −621 |
| $CeBr_3$ | −616 |
| $PrBr_3$ | −612 |
| $UBr_4$ | −602 |
| $NdBr_3$ | −598 |
| $HoBr_3$ | −567 |
| $ErBr_3$ | −566 |
| $TmBr_3$ | −563 |
| $TbBr_3$ | −559 |
| $DyBr_3$ | −559 |
| $GdBr_3$ | −551 |
| $Li_2Br_2$ | −534 |
| $TiBr_4$ | −527 |
| $Na_2Br_2$ | −510 |
| $SrBr_2$ | −453 |
| $CaBr_2$ | −435 |
| $PbBr_4$ | −428 |
| $TaBr_5$ | −424 |
| $EuBr_2$ | −413 |
| $SiBr_4$ | −387 |
| $Cu_3Br_3$ | −187 |
| $WBr_6$ | −139 |
| $HBr$ | −58.6 |

TABLE 4

The Gibbs free energies of gaseous compounds containing fluorine (F) at 427° C.

| compound | gibbs free energy (kJ/mol) |
|---|---|
| $Al_2F_6$ | −2439 |
| $UF_6$ | −1953 |
| $TaF_5$ | −1687 |
| $ThF_4$ | −1687 |
| $Mg_2F_4$ | −1624 |
| $NbF_5$ | −1607 |
| $HfF_4$ | −1592 |
| $ZrF_4$ | −1587 |
| $S_2F_{10}$ | −1581 |
| $SiF_4$ | −1515 |
| $WF_6$ | −1513 |
| $TiF_4$ | −1467 |
| $Li_3F_3$ | −1457 |
| $PrF_3$ | −1231 |
| $AsF_5$ | −1080 |
| $CuF_2$ | −287.3 |
| $HF$ | −277.1 |

TABLE 5

The Gibbs free energies of gaseous compounds containing platinum (Pt) at 427° C.

| compound | gibbs free energy (kJ/mol) |
| --- | --- |
| $PtCl_2$ | −78.6 |
| $PtBr_2$ | +29.2 |
| $PtI_4$ | +62.8 |
| $PtCl_3$ | −105.9 |
| $PtBr_3$ | +27.3 |
| $PtCl_4$ | −141.9 |
| $PtBr_4$ | −38.2 |

After the metal layer such as titanium, tantalum, zircium, hafnium, cobalt, molybdenum, tungsten, nickel or platinum is formed by a replacement method using the metal halide gas, a purge gas is supplied to the chamber, in step 150. Here, the supply time and amount of purge gas are greater than in the step of forming the sacrificial metal layer and in other steps. Therefore, the metal halide gas such as $TiCl_x$ adsorbed in a portion such as the insulating film, but not the sacrificial metal layer, is desorbed and purged.

Figure 2A:
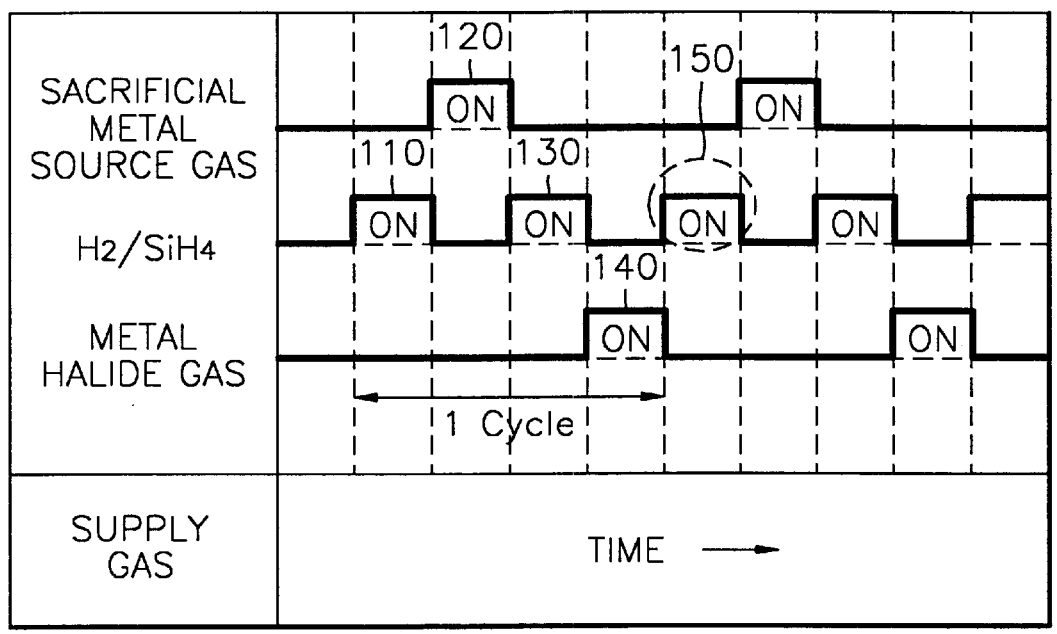
FIGS. 2A and 2B are gas flow graphs of the process for forming a selective metal layer according to the present invention.
Figure 2B:
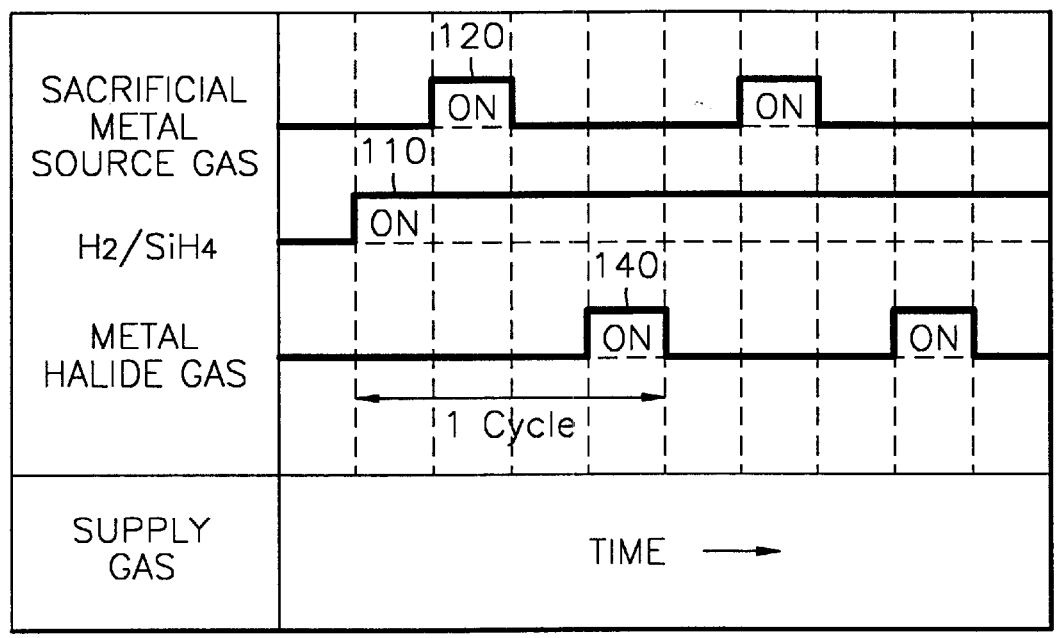

FIGS. 2A and 2B are gas flow graphs of the selective metal layer formation process according to the present invention, wherein a Y axis denotes the supply state of a gas, and a X axis denotes time. FIG. 2A is the gas flow graph when a purge gas of hydrogen $H_2$ and silane $SiH_4$ is supplied periodically. FIG. 2B is the gas flow graph when the purge gas is continuously supplied from the beginning. The purge gas can be hydrogen $H_2$, silane $SiH_4$, nitrogen $N_2$, argon Ar, or a mixture of two or more of the above gases instead of a mixture of hydrogen $H_2$ and silane $SiH_4$. When the purge gas is periodically supplied as shown in FIG. 2A, a purge gas 150 is supplied for a longer time and in a larger amount, right after a metal halide gas is supplied, to prevent the metal halide gas from being absorbed into the insulating film and to sufficiently desorb the metal halide gas from the insulating film. To be more specific, a purge gas 110 is first supplied, and a sacrificial metal source gas 120 is then supplied to form a sacrificial metal layer. When a purge gas is periodically supplied, a purge gas 130 is supplied to the chamber to purge the remaining sacrificial metal source gas. Also, a metal halide gas including a metal to be deposited is supplied to replace a sacrificial metal layer with a deposition metal layer. At this time, a compound gas of sacrificial aluminum, aluminum halides, and halogen atoms remains in the chamber, and this is again purged to the outside of the chamber by supplying the purge gas 150 to the chamber. This process is set as a cycle, and when this cycle is repeated, the thickness of a deposited metal can be easily controlled, and step coverage problems can be solved.

Figure 3:
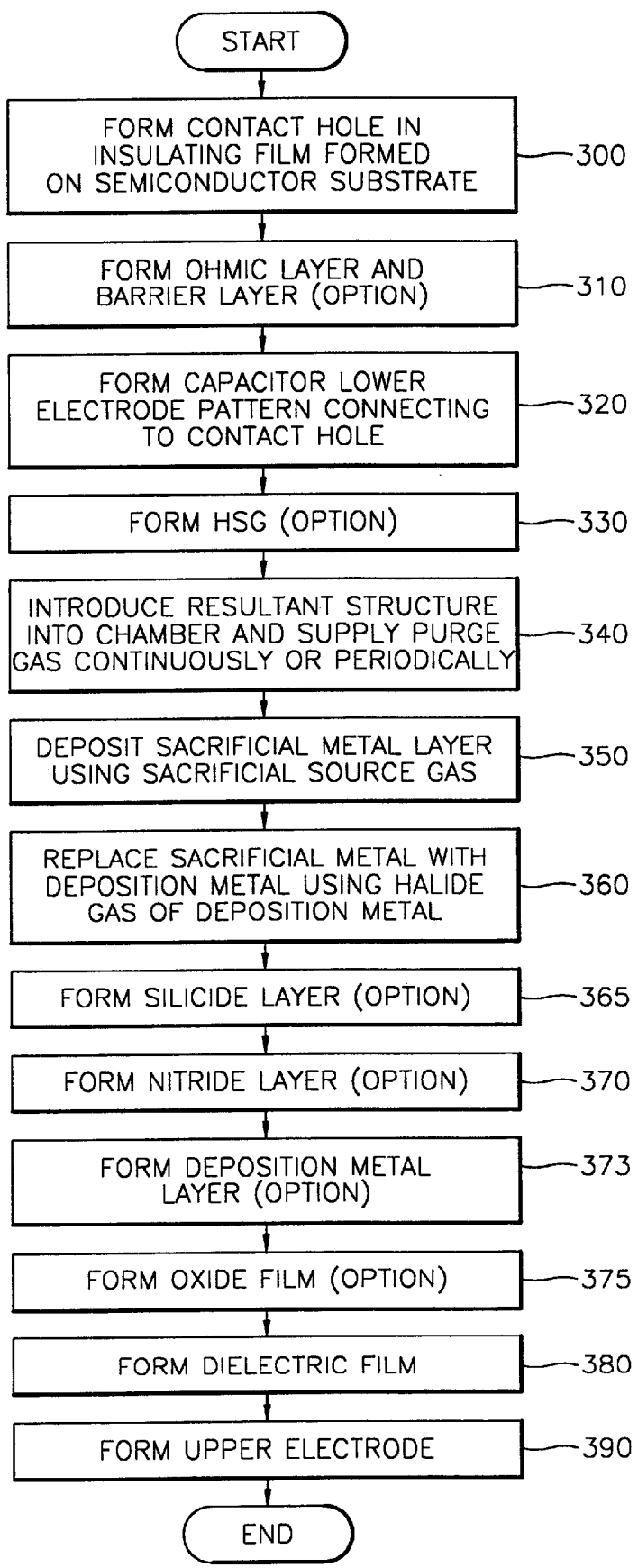
FIG. 3 is a flowchart illustrating a method of forming a capacitor using the selective metal layer formation process according to the present invention.

Method of Forming a Capacitor of a Semiconductor Device Using the Selective Metal Layer Formation Method FIG. 3 is a flowchart illustrating a method of forming a capacitor using the selective metal layer formation process according to the present invention.

Referring to FIG. 3, a lower structure such as a transistor is formed, and an insulating film as an interlayer dielectric (ILD) is formed using an oxide film or a complex film including the oxide film. A contact hole exposing a source area of a transistor is formed by performing photolithography on the insulating film, in step 300. Optionally, an ohmic layer and barrier layer can be formed using a material such as titanium (Ti) or titanium nitride (TiN), to improve conductivity between the contact hole and a filling material and prevent diffusion, in step 310. Then, a conductive layer covering the surface of the insulating film is formed by filling the contact hole using a conductive material for a lower electrode, e.g., a metallic material such as TiN or polysilicon doped with impurities. Here, it is preferable that the impurities doped in the polysilicon have hydrogen termination radical to allow a sacrificial metal layer to be selectively formed in the subsequent process. The conductive layer can be formed of a refractory metal, a refractory metal nitride, a refractory carbide, a metal silicide, conductive Perovskite, a platinum-family metal, a conductive platinum-family oxide, or a mixture of two or more of the above materials, instead of TiN.

Next, a conductive layer pattern for use as lower electrode connected to the contact hole is formed by patterning the conductive layer, in step 320. The conductive layer pattern can be formed after forming a plug layer for filling only the inside of the contact hole, or by simultaneously depositing and patterning a conductive layer for filling the inside of the contact hole. Here, the step 330 of forming hemispherical grains (HSG) on the conductive layer pattern can be optionally performed to increase the surface area of the lower electrode. Then, the semiconductor substrate with the HSG is introduced into a chamber of semiconductor manufacturing equipment, and a purge gas is supplied continuously or periodically as shown in FIGS. 2A and 2B, in step 340. A sacrificial metal source gas DMAH (($CH_3)_2ALH$) or DMEAA(($CH_3)_2C_2H_5N$:$AlH_3$) is supplied to the chamber, and a sacrificial metal layer of aluminum is formed selectively on only the conductive layer, in step 350. A metal halide gas containing a metal to be deposited, e.g., $TiCl_4$, platinic chloride ($Cl_6H_6Pt$), or $PtCl_2$, is melted in water ($H_2O$) or alcohol and then vaporized, and the vapor is supplied to form a deposition metal layer made of Ti or Pt using a replacement method, in step 360. Then, a silicide layer can be optionally formed by conducting a thermal treatment on the deposition metal layer, in step 365. A nitride film can be optionally formed using ammonia plasma or rapid thermal nitridation (RTN), in step 370. An oxide film can optionally be formed by performing a thermal treatment at an oxygen atmosphere, in step 375. Then, the nitride film and oxide film can be used as the dielectric film of a capacitor.

Here, when Ti is used as the first deposition metal layer, TiN is formed as the nitride film, and the selective metal layer formation process shown in FIG. 1 is repeated, thereby forming a second deposition metal layer made of platinum in step 373. The step 373 is optional.

Thereafter, the dielectric film is deposited on the resultant structure, in step 380. The dielectric film can be a complex film of an oxide film and a nitride film, or can be formed of a monatomic metal oxide selected from the group consisting of $Ta_2O_5$, $TiO_2$, $ZrO_2$, $Al_2O_3$, and $Nb_2O_5$, a monatomic metal nitride such as AlN, or a polyatomic metal oxide selected from the group consisting of $SrTiO_3$, PZT(Pb(Zr,Ti)$O_3$), and BST((Ba,Sr)$TiO_3$). Finally, an upper electrode is formed on the semiconductor substrate on which the dielectric film is formed, using polysilicon or a metal such as TiN, TiAlN, or TiSiN, in step 390.

First Embodiment

FIGS. 4A through 4F are cross-sectional views illustrating a method of forming a capacitor using a selective metal layer formation process according to a first embodiment of the present invention.

Figure 4A:
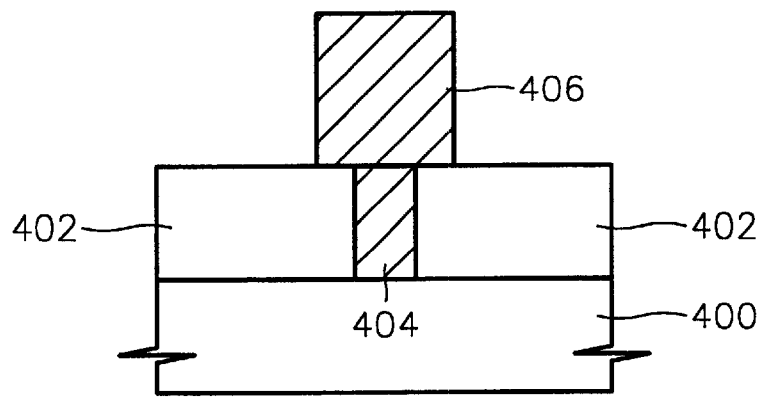
FIGS. 4A through 4F are cross-sectional views illustrating a method of forming a capacitor using the process for forming a selective metal layer, according to a first embodiment of the present invention.

Referring to FIG. 4A, a lower structure (not shown) such as a transistor is formed on a semiconductor substrate 400, and an oxide film or a complex film including the oxide film is formed as an interlayer dielectric (ILD) 402 on the resultant structure. A contact hole 404 exposing a source area of the transistor is formed by patterning the ILD 402. Polysilicon which is doped with impurities and has hydrogen termination radical is deposited on the semiconductor substrate in which the contact hole 404 is formed, and the deposited polysilicon is patterned, thus forming a lower electrode conductive layer pattern 406 connected to the contact hole. The conductive layer pattern 406 can be formed of a refractory metal, a refractory metal nitride, a refractory carbide, a metal silicide, conductive Perovskite, a platinum-family metal, a conductive platinum-family oxide, or a mixture of two or more of the above materials, instead of the pollysilicon doped with impurities.

Figure 4B:
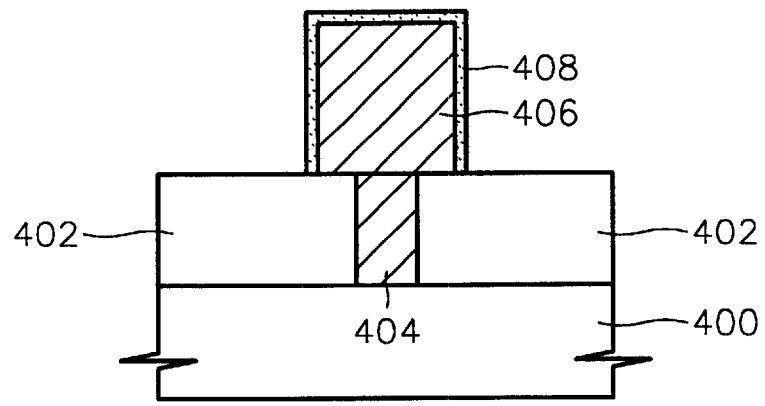

Referring to FIG. 4B, a deposition metal layer 408 such as Ti or Pt is formed on the resultant structure, using the selective metal layer deposition method shown in FIG. 1. Here, a process for forming HSG can optionally be performed on the conductive layer pattern 406 before the deposition metal layer is formed, in order to increase the surface area of the lower electrode of the capacitor. Thus, in the present invention, an HSG surface is formed, and the selective metal layer deposition according to the present invention is performed, whereby a capacitor having a metal insulator silicon (MIS) structure can be formed.

Figure 4C:
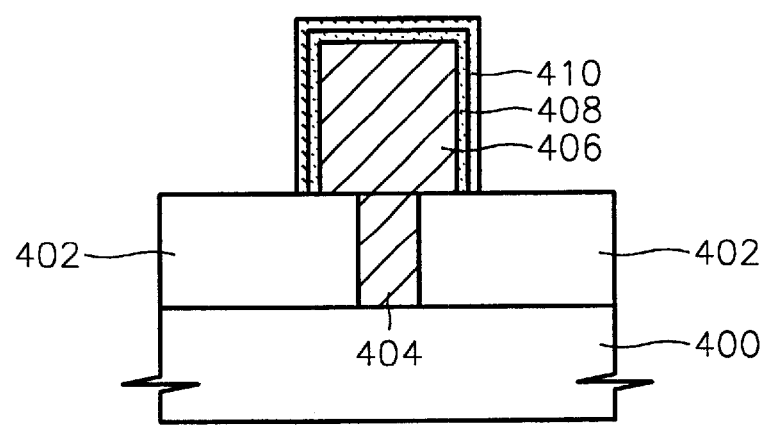

Referring to FIG. 4C, a nitride film 410 is formed on the semiconductor substrate on which the deposition metal layer 408 is formed, by nitridation or RTN using ammonia plasma ($NH_3$ plasma). The nitride film 410 prevents oxidation at the interface between the lower electrode and the dielectric film when the dielectric film is deposited in the subsequent process which would degrades capacitance.

Figure 4D:
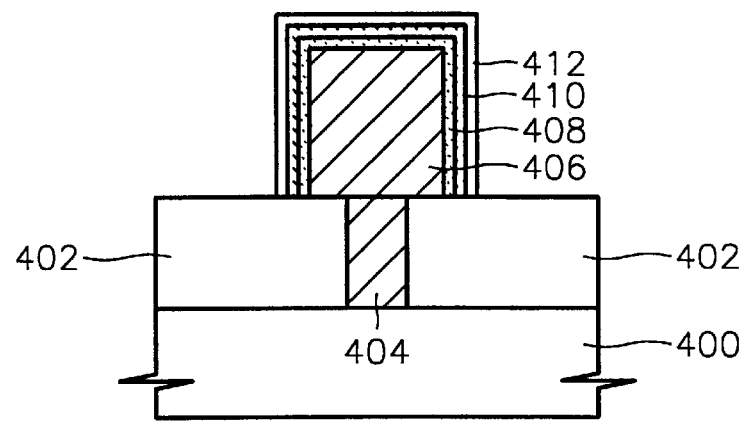

Referring to FIG. 4D, an oxide film 412, e.g., titanium oxide $TiO_2$, is formed by performing a thermal treatment in oxygen atmosphere on the resultant structure. The nitride film 410 and the oxide film 412 can be used as the dielectric film.

Figure 4E:
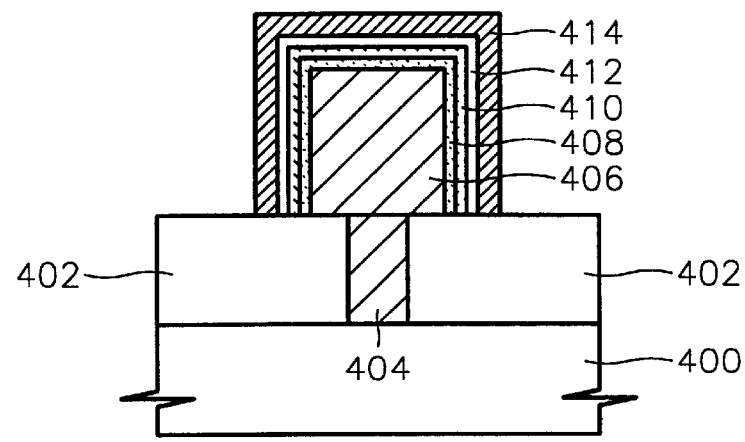

Referring to FIG. 4E, the dielectric film 414 is formed on the resultant structure, using a monatomic metal oxide selected from the group consisting of $Ta_2O_5$, $TiO_2$, $ZrO_2$, $Al_2O_3$, and $Nb_2O_5$, a monatomic metal nitride such as AlN, or a polyatomic metal oxide selected from the group consisting of $SrTiO_3$, PZT(Pb(Zr, Ti) $O_3$), and BST((Ba, Sr)$TiO_3$).

Figure 4F:
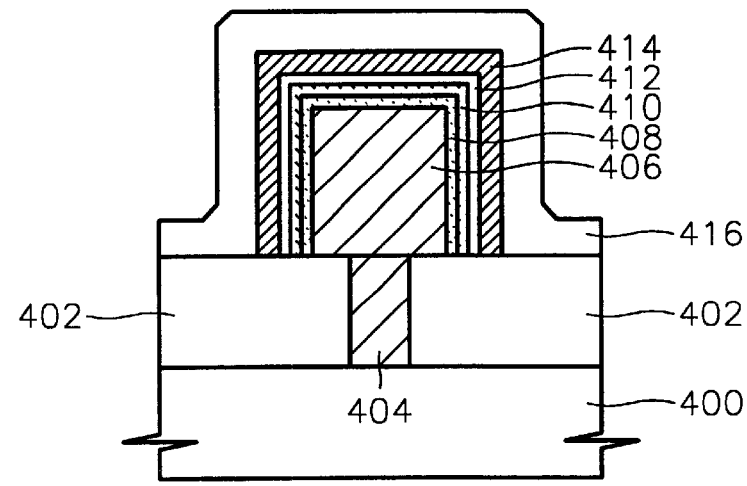

Referring to FIG. 4F, an upper electrode 416 of polysilicon or a metal is formed on the semiconductor substrate on which the dielectric film 414 is formed, thereby forming the capacitor of a semiconductor device having a structure of metal insulator silicon (MIS) or metal insulator metal (MIM).

If the capacitor of a semiconductor device is formed as described above, a photo process can be omitted since patterning is not required after the lower electrode is formed. Particularly, patterning on a lower electrode having HSG is not required, so that the lower electrode can be formed of a metal while avoiding many problems caused by etching.

Second Embodiment

FIGS. 5A through 5F are cross-sectional views illustrating a method of forming a capacitor using a selective metal layer formation process according to a second embodiment of the present invention.

Figure 5A:
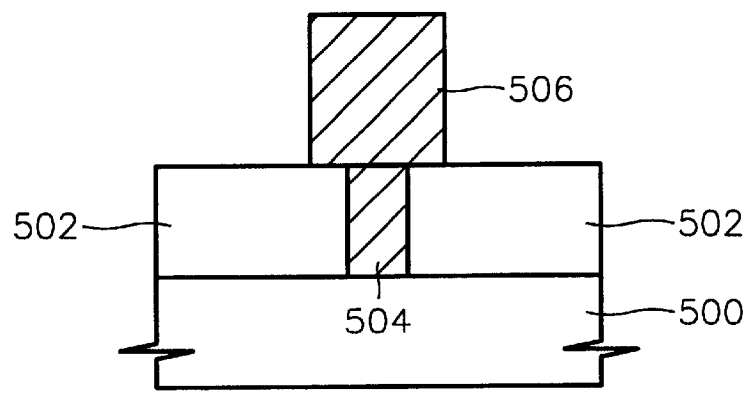
FIGS. 5A through 5F are cross-sectional views illustrating a method of forming a capacitor using the process for forming a selective metal layer, according to a second embodiment of the present invention.
Figure 5B:
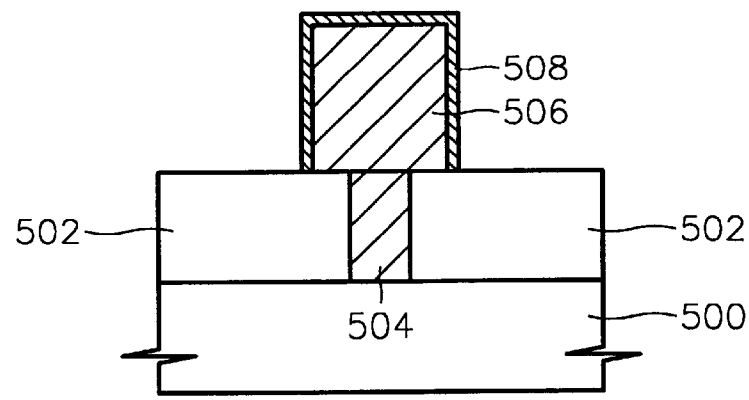

Since processes shown in FIGS. 5A and 5B are the same as those in the first embodiment, the descriptions of these processes are omitted to avoid redundancy. Here, reference numerals correspond to those in the first embodiment for the sake of easy understanding.

Figure 5C:
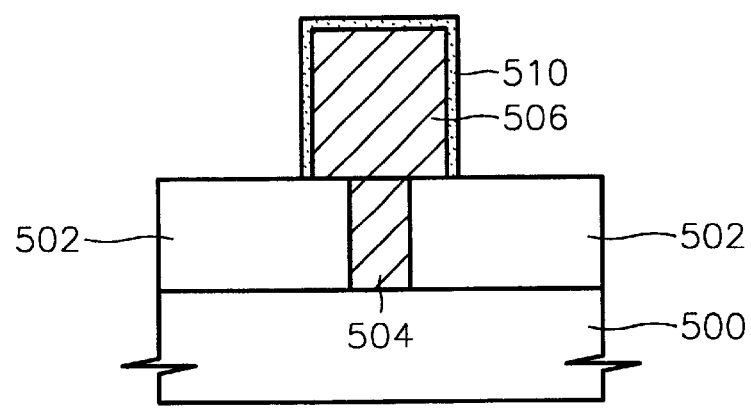

Referring to FIG. 5C, a deposition metal layer 508, being the selective metal layer, is changed into a silicide layer 510 such as TiSix by performing silicidation on the semiconductor substrate on which the deposition metal layer 508 is formed.

Figure 5D:
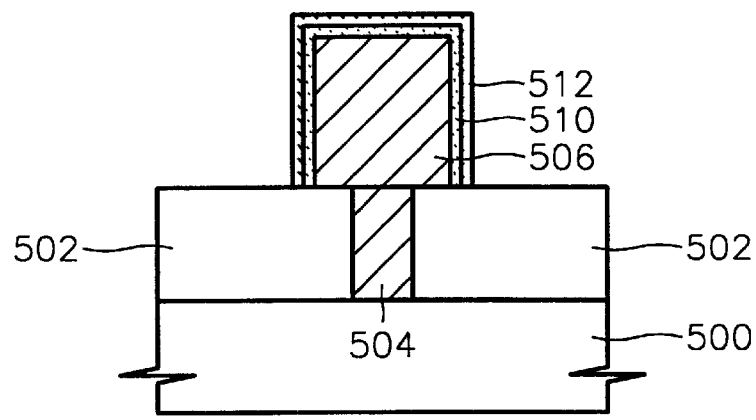

Referring to FIG. 5D, a nitride film 512 is formed on the semiconductor substrate on which the silicide layer 510 is formed, using $NH_3$ plasma or by performing RTN.

Figure 5E:
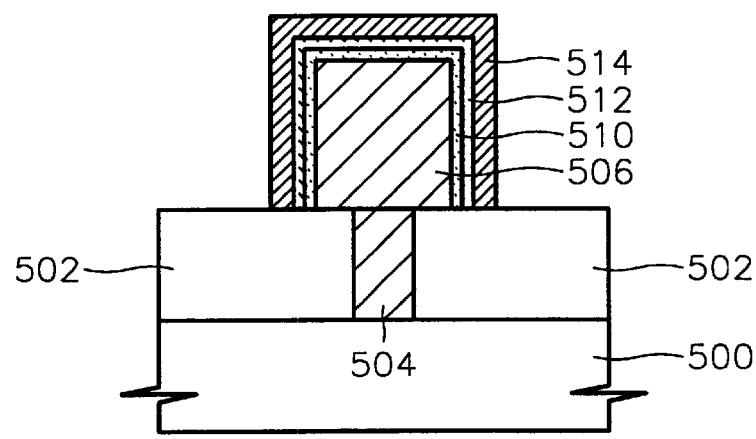

Referring to FIG. 5E, a dielectric film 514 can be formed on the semiconductor substrate on which the nitride film 510 is formed. Here, the dielectric film 514 can be a complex film of an oxide film and a nitride film, or can be formed of a monatomic metal oxide selected from the group consisting of $Ta_2O_5$, $TiO_2$, $ZrO_2$, $Al_2O_3$, and $Nb_2O_5$, a monatomic metal nitride such as AlN, or a polyatomic metal oxide selected from the group consisting of $SrTiO_3$, PZT(Pb(Zr, Ti)$O_3$), and BST((Ba, Sr) $TiO_3$).

Figure 5F:
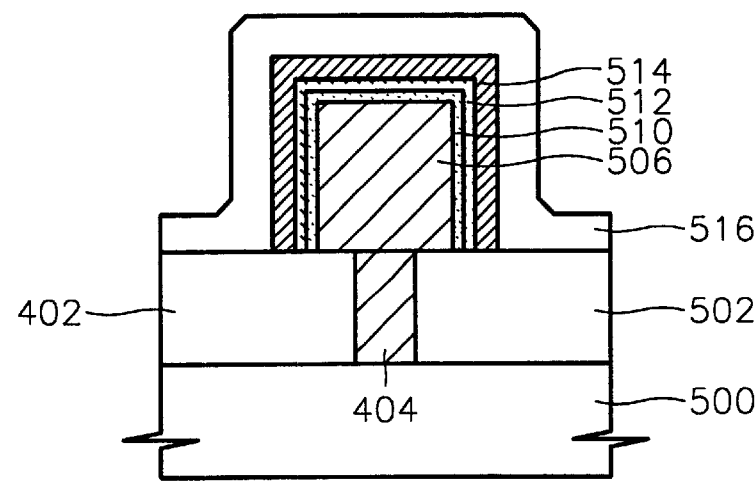

Referring to FIG. 5F, an upper electrode 516 of polysilicon or a metal is formed on the semiconductor substrate on which the dielectric film is formed, thereby forming the capacitor of an MIS or MIM structure.

Third Embodiment

Figure 6A:
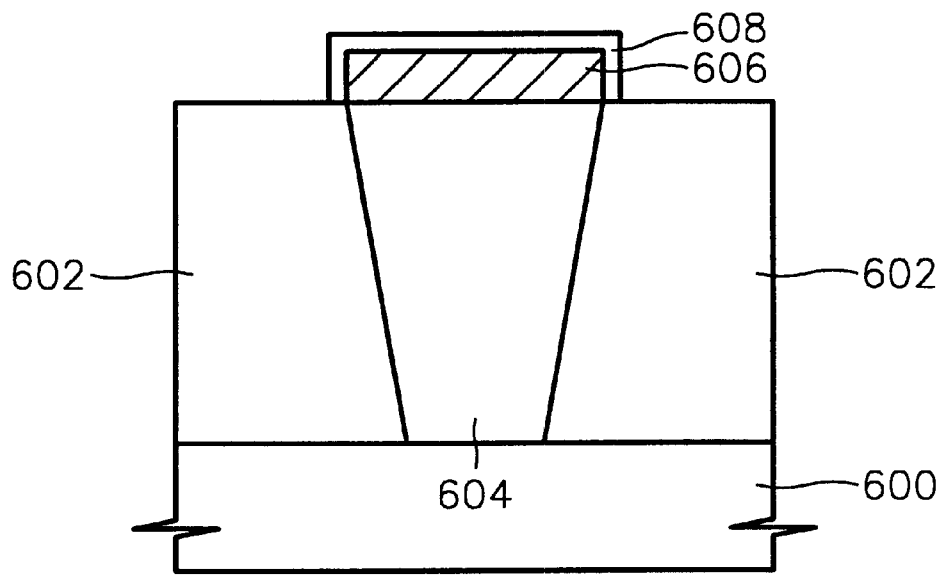
FIGS. 6A through 6C are cross-sectional views illustrating a method of forming a capacitor using the process for forming a selective metal layer, according to a third embodiment of the present invention.
Figure 6B:
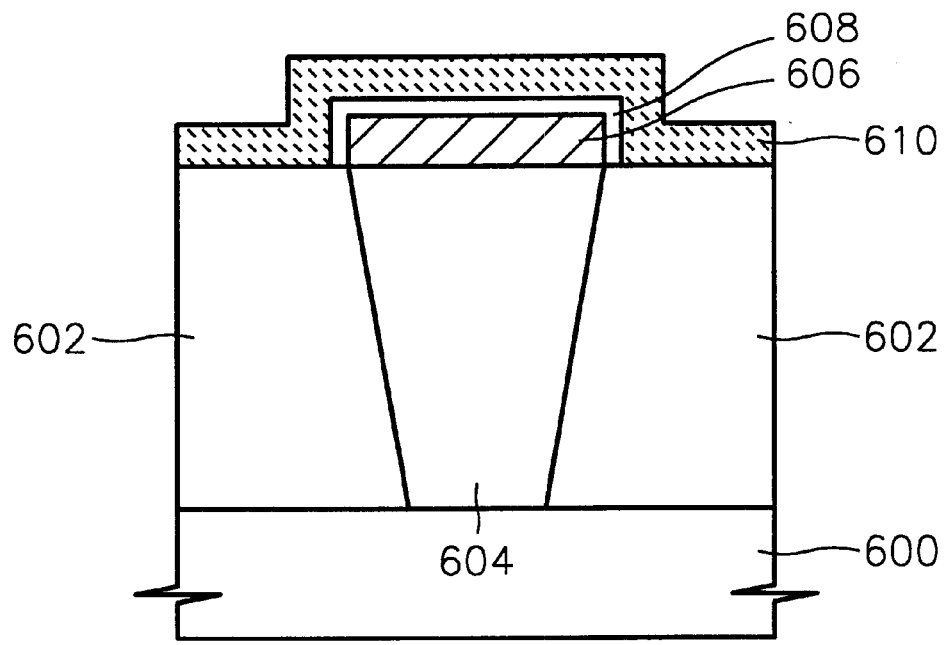
Figure 6C:
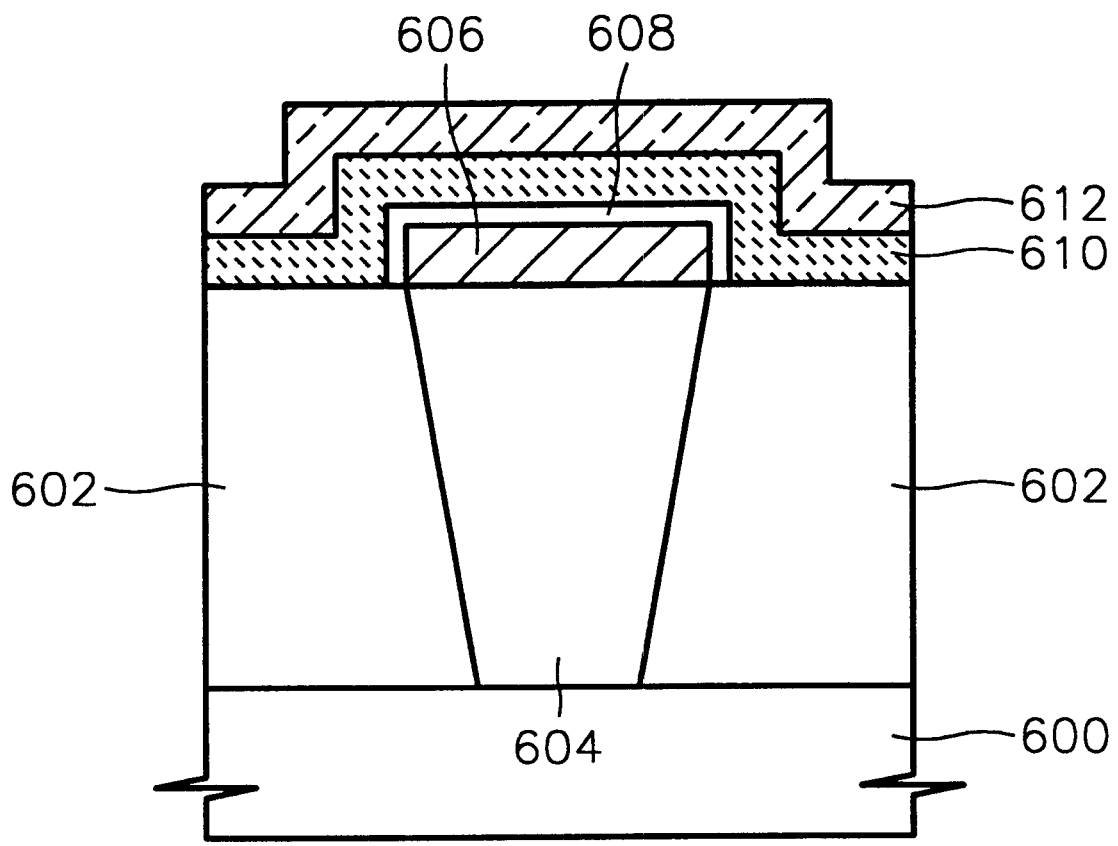

FIGS. 6A through 6C are cross-sectional views illustrating a method of forming a capacitor using a selective metal layer formation method according to a third embodiment of the present invention.

The present embodiment can use the selective metal layer deposition process twice, to prevent a highly-resistive platinum silicide PtSix from forming when a platinum film is deposited selectively on a capacitor lower electrode.

Referring to FIG. 6A, a lower structure (not shown) such as a transistor is formed on a semiconductor substrate 600, and an inter layer dielectric (ILD) 602 is formed on the resultant structure, using an oxide film or a complex film including the oxide film. A contact hole exposing a source region of the transistor is formed on the semiconductor substrate 600. A plug layer 604 for filling the contact hole is formed using polysilicon. Titanium nitride TiN being a capacitor lower electrode conductive layer, connected to the plug layer 604, is blanket-deposited by chemical vapor deposition (CVD) or physical vapor deposition. The capacitor lower electrode conductive layer is patterned to form a capacitor lower electrode conductive film pattern 606. Then, a platinum film 608 is formed on the surface of the TiN conductive film pattern 606, using the selective metal layer formation method shown in FIG. 1.

The capacitor lower electrode conductive film pattern 606 covered with the platinum film 608 can also be formed by the following modified method. After the contact hole exposing the source region of the transistor is formed, the plug layer 604 for filling the contact hole is formed of polysilicon doped with impurities having hydrogen termination radical. Titanium is selectively deposited on the surface of the exposed plug layer 604 by the selective metal layer formation method of FIG. 1, thereby forming a planer type lower electrode conductive film pattern 606. The Ti conductive film pattern 606 undergoes nitridation using $NH_3$ plasma, or rapid thermal nitridation (RTN), to form TiN on the resultant structure. Thereafter, the platinum film 608 is formed by the selective metal layer formation method of FIG. 1, thereby forming the capacitor lower electrode formed of the platinum film.

Referring to FIG. 6B, a dielectric film 610 is deposited on the platinum film 608. Here, the dielectric film 610 can be a complex film of an oxide film and a nitride film, or can be formed of a monatomic metal oxide selected from the group consisting of $Ta_2O_5$, $TiO_2$, $ZrO_2$, $Al_2O_3$, and $Nb_2O_5$, a monatomic metal nitride such as AlN, or a polyatomic metal oxide selected from the group consisting of $SrTiO_3$, PZT (Pb(Zr, Ti)$O_3$), and BST((Ba,Sr)$TiO_3$).

Referring to FIG. 6C, a capacitor upper electrode 612 is formed on the semiconductor substrate on which the dielectric film 610 is formed, using polysilicon or a metal such as platinum, thereby completing the formation of the capacitor of a semiconductor device using the selective metal layer formation method according to the third embodiment of the present invention.

Contact Hole Filling Method Using Selective Metal Layer Formation Method

Figure 7:
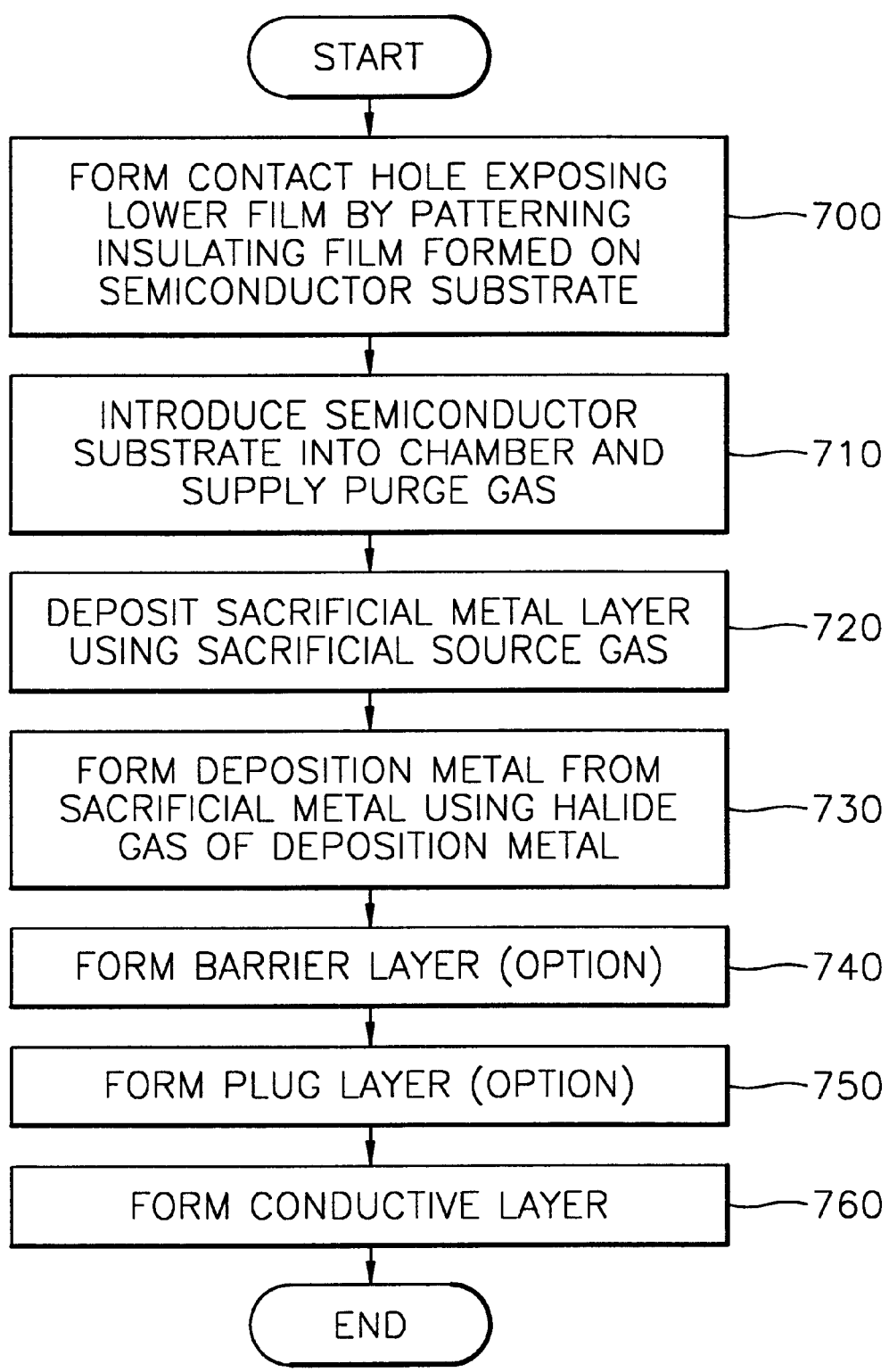
FIG. 7 is a flowchart showing a method of filling a contact hole using the selective metal layer formation process according to the present invention.

FIG. 7 is a flowchart showing a method of filling a contact hole using the selective metal layer formation process according to the present invention.

Referring to FIG. 7, an insulating film is deposited on a semiconductor substrate on which a lower structure such as a transistor bit line is formed, using an interlayer dielectric (ILD), and a contact hole exposing a lower film is formed by patterning the ILD, in step 700. Here, the ILD is an oxide film or a complex film including the oxide film, and the lower film is formed of TiN, or polysilicon doped with impurities having hydrogen termination. The lower film can be formed of a refractory metal, a refractory metal nitride, a refractory carbide, a metal silicide, conductive Perovskite, a platinum-family metal, a conductive platinum-family oxide, or a mixture of two or more of the above materials.

Here, the contact hole can be a capacitor lower electrode contact hole directly connected to the semiconductor substrate, or a metal contact hole. Next, a deposition metal layer of a material such as titanium (Ti) is formed on the bottom of the contact hole, using the selective metal layer formation method shown in FIG. 1, in steps 710, 720 and 730. The deposition metal layer formed of a conductive material such as titanium (Ti) is used as an ohmic layer, in a process for filling the contact hole. Then, a barrier layer such as titanium nitride (TiN) is optionally formed on the ohmic layer being the deposition metal layer, by RTN, or nitridation using $NH_3$ plasma, in step 740. A plug layer is formed of aluminum (Al) and tungsten (W) on the barrier layer, in step 750. A conductive layer connected to the plug layer is formed in step 760, thereby completing the filling of the contact hole. Here, without specially forming the plug layer, a conductive layer for filling a contact hole can be formed directly on the barrier layer or ohmic layer.

In the step 740, the barrier layer can be formed and patterned by a blanket method of CVD or sputtering, instead of RTN or nitridation using $NH_3$ plasma.

Fourth Embodiment

FIGS. 8A through 8E are cross-sectional views illustrating a method of filling a contact hole using a selective metal layer formation process according to a fourth embodiment of the present invention.

Figure 8A:
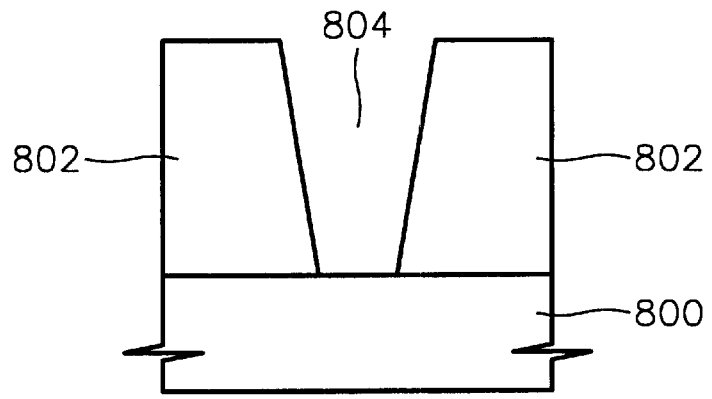
FIGS. 8A through 8E are cross-sectional views illustrating a contact hole filling method using the selective metal layer formation process, according to a fourth embodiment of the present invention.

Referring to FIG. 8A, an insulating film 802, e.g., an oxide film or a complex film including the oxide film, is formed on a semiconductor substrate 800, and a contact hole 804 exposing a lower film is formed by patterning the insulating film 802. Here, the contact hole 804 can be a capacitor lower electrode contact hole connected to the semiconductor substrate, or a metal contact hole formed in a metal interconnection process.

Figure 8B:
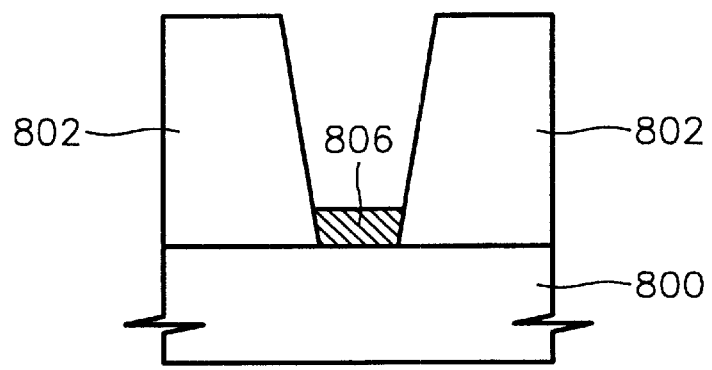

Referring to FIG. 8B, a deposition metal layer of a material such as titanium (Ti) is formed on the semiconductor substrate on which the contact hole 804 is formed, using the selective metal layer formation method of FIG. 1. The deposition metal layer serves as an ohmic layer 806 for improving the conductivity between the lower film and a conductive material for filling the contact hole, in the process for filling the contact hole.

Figure 8C:
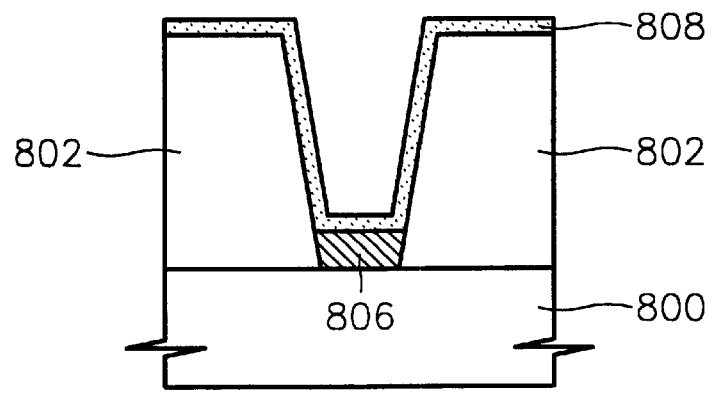

Referring to FIG. 8C, a barrier layer 808 for preventing diffusion of impurities, e.g., a titanium nitride (TiN) layer, is optionally formed on the semiconductor substrate on which the ohmic layer 806 is deposited. The barrier layer can be formed by nitridation using $NH_3$ plasma, RTN, or blanket deposition.

Figure 8D:
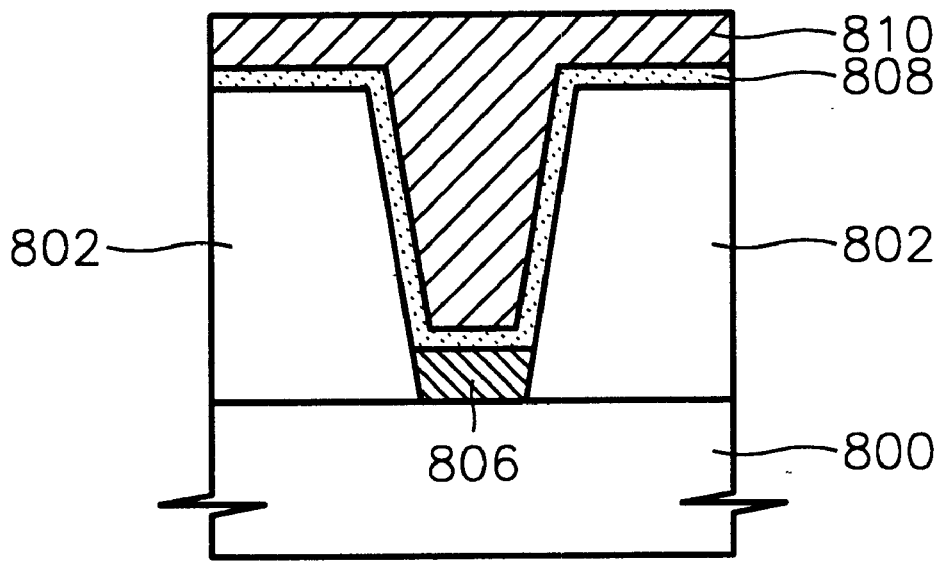

Referring to FIG. 8D, a conductive layer 810 for covering the surface of the semiconductor substrate while filling the contact hole is deposited on the semiconductor substrate on which the barrier layer 808 is formed, thereby completing the contact hole filling process using the selective metal layer formation method according to the fourth embodiment of the present invention.

Figure 8E:
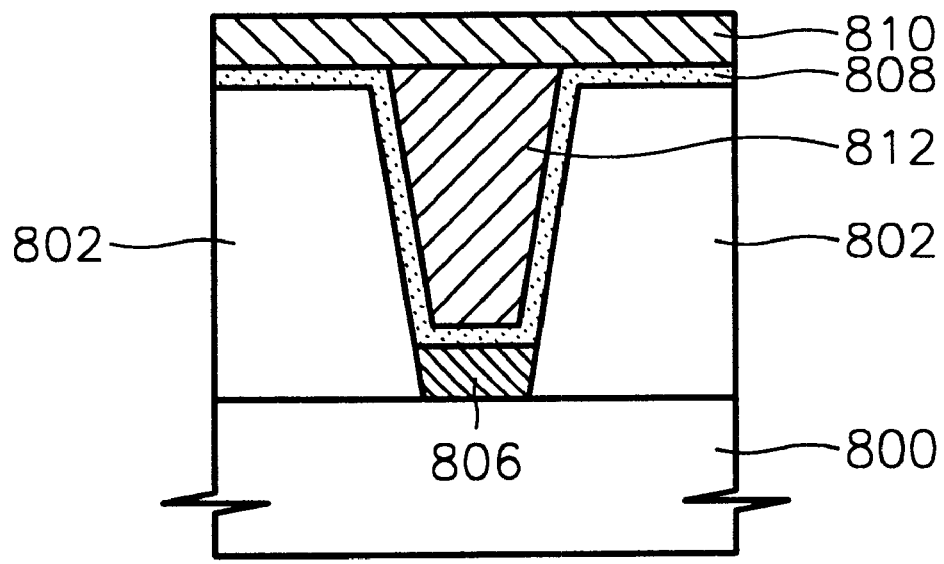

FIG. 8E is a cross-sectional view of a modification of FIG. 8D. Here, a plug layer 812 is formed of tungsten (W) or aluminum (Al) on the semiconductor substrate on which the barrier layer 808 is formed. Next, the plug layer 812 is removed except inside the contact hole, by etchback or chemical mechanical polishing (CMP). The conductive layer 810 is then formed in contact with the plug layer 812.

Therefore, according to the present embodiment, a relatively thin ohmic layer can be formed inside a contact hole having a high aspect ratio without problems such as lifting or corrosion, at a temperature of 500° C. or lower. This renders unnecessary a process for controlling the thickness of the ohmic layer, e.g., the etchback process.

According to the present invention as described above, since a metal layer of a material such as titanium (Ti) or platinum (Pt) is selectively formed of at a temperature of 500° C. or lower, a lower electrode can be easily formed of a metal instead of polysilicon in the process for forming a capacitor of a semiconductor device. Therefore, many problems generated in the prior art when the lower electrode is formed of titanium or platinum can be solved. Also, in the process for forming an ohmic layer on the bottom of a contact hole, the ohmic layer having an appropriate thickness is formed selectively at low temperature on only the bottom of the contact hole, thus filling the contact hole while preventing defects such as lifting or corrosion.

The present invention is not limited to the above embodiments, and it is apparent that various modifications within the technical spirit of the present invention may be effected by those skilled in the art.

What is claimed is:

1. A method of forming a selective metal layer on a semiconductor substrate, the method comprising the steps of:

forming a conductive layer on the substrate;

forming an insulative layer over the conductive layer;

etching a portion of the insulative layer and exposing a portion of the conductive layer;

selectively forming a sacrificial metal layer on the exposed portion of the conductive layer by exposing the exposed portion of the conductive layer and the insulative layer to a sacrificial metal source gas which is deposited selectively on the conductive layer; and replacing the sacrificial metal layer with a deposition metal layer by supplying a metal halide gas having a halogen coherence smaller than the halogen coherence of metal atoms in the sacrificial metal layer.

2. The method of claim 1, further comprising the step of supplying a purge gas before the sacrificial metal source gas is supplied.

3. The method of claim 1, further comprising the steps of:

supplying a purge gas after the sacrificial metal layer is formed; and supplying a purge gas after the sacrificial metal layer is replaced with the deposition metal layer.

4. The method of claim 3, wherein a deposition metal layer having a desired thickness is formed by repeating the steps of:

forming the sacrificial metal layer;

supplying a purge gas after the sacrificial metal layer is formed;

replacing the sacrificial metal layer with the deposition metal layer; and supplying a purge gas after the sacrificial metal layer is replaced with the deposition metal layer.

5. The method of claim 1, wherein the insulative layer comprises an oxide.

6. The method of claim 1, wherein the conductive layer is formed of a material selected from the group consisting of silicon doped with impurities and a metal containing material.

7. The method of claim 6, wherein the silicon doped with impurities has hydrogen termination radical.

8. The method of claim 6, wherein the metal containing material for the conductive layer is selected from the group consisting of a refractory metal, a refractory metal nitride, a refractory carbide, a metal silicide, conductive Perovskite, a platinum-family metal, a conductive platinum-family oxide, and a mixture of two or more of the above materials.

9. The method of claim 2, wherein the purge gas is selected from the group consisting of hydrogen ($H_2$), silane ($SiH_4$), nitrogen ($N_2$), argon (Ar) and a mixture of two or more of the above gases.

10. The method of claim 3, wherein the purge gas is selected from the group consisting of hydrogen ($H_2$), silane ($SiH_4$), nitrogen ($N_2$), argon (Ar), and a mixture of two or more the above gases.

11. The method of claim 9, wherein the purge gas is continuously supplied.

12. The method of claim 10, wherein the purge gas is continuously supplied, or first supplied in a predetermined amount to purge and periodically supplied in predetermined amounts after the sacrificial metal layer is formed and after the sacrificial metal layer is replaced with the deposition metal layer.

13. A method of forming a capacitor of a semiconductor device using a selective metal layer formation method, comprising the steps of:

(a) forming a source region on a semiconductor substrate;

(b) forming an insulating film on a substrate and patterning the insulating film to expose the source region on the substrate;

(c) forming a conductive layer pattern on the insulating film and connected to the contact hole;

(c) selectively forming a sacrificial metal layer on the conductive layer, by exposing the conductive layer and the insulating film to a sacrificial metal source gas which is deposited selectively on the conductive layer;

(d) replacing the sacrificial metal layer with a deposition metal layer by supplying a metal halide gas, the metal having a halogen coherence smaller than the halogen coherence of metal atoms in the sacrificial metal layer;

(e) forming a dielectric film on the deposition metal layer; and (f) forming an upper electrode on the dielectric film.

14. The method of claim 13, further comprising the step of supplying a purge gas before the step (c) of supplying the sacrificial metal source gas.

15. The method of claim 14, wherein the purge gas is continuously supplied, or first supplied in a predetermined amount to purge and periodically supplied in predetermined amounts after the sacrificial metal layer is formed and after the sacrificial metal layer is replaced with the deposition metal layer.

16. The method of claim 13, wherein the insulating film comprises an oxide.

17. The method of claim 13, wherein the conductive layer pattern in the step (b) is formed of a material selected from the group consisting of polysilicon doped with impurities and a metal containing material.

18. The method of claim 13, further comprising the step of siliciding the deposition metal layer after the step (d) of replacing the sacrificial metal layer with the deposition metal layer.

19. The method of claim 17, wherein the metal containing material for the conductive layer pattern is selected from the group consisting of a refractory metal, a refractory metal nitride, a refractory carbide, a metal silicide, conductive Perovskite, a platinum-family metal, a conductive platinum-family oxide, and a mixture of two or more of the above materials.

20. The method of claim 13, wherein a deposition metal layer having a desired thickness is formed by repeating the step (c) of forming the sacrificial metal layer and the step (d) of replacing the sacrificial metal layer with the deposition metal layer.

21. The method of claim 13, wherein a deposition metal layer having a desired thickness is formed by repeating the steps of forming the sacrificial metal layer, of supplying a purge gas, of replacing the sacrificial metal layer with the deposition metal layer, and of supplying a purge gas.

22. A method of filling a contact hole using a selective metal layer formation method, comprising the steps of:

(a) forming a first conductive layer on a semiconductor substrate;

(b) forming an insulating film on the first conductive layer and forming a contact hole exposing a portion of the first conductive layer by patterning the insulating film;

(c) forming a sacrificial metal layer on the exposed portion of the first conductive layer by supplying a sacrificial metal source gas which is deposited selectively on the exposed portion of the first conductive layer;

(d) replacing the sacrificial metal layer with a deposition metal layer by supplying a metal halide gas, the metal having a halogen coherence smaller than the halogen coherence of metal atoms in the sacrificial metal layer; and (e) forming a second conductive layer filling the contact hole.

23. The method of claim 22, wherein the insulating film in the step (a) comprises an oxide.

24. The method of claim 22, wherein the lower film in the step (a) is formed of a material selected from the group consisting of a refractory metal, a refractory metal nitride, a refractory metal carbide, and silicon doped with impurities having hydrogen termination radical.

25. The method of claim 22, further comprising the step of supplying a purge gas before the step (b) of forming the sacrificial metal layer.

26. The method of claim 25, wherein the purge gas is continuously supplied, or first supplied in a predetermined amount to purge and periodically supplied in predetermined amounts after the sacrificial metal layer is formed and after the sacrificial metal layer is replaced with the deposition metal layer.

27. The method of claim 25, wherein the purge gas is selected from the group consisting of hydrogen ($H_2$), silane ($SiH_4$), nitrogen ($N_2$), argon (Ar), and a mixture of two or more of the above gases.

28. The method of claim 26, wherein the purge gas is selected from the group consisting of hydrogen ($H_2$), silane ($SiH_4$), nitrogen ($N_2$), argon (Ar), and a mixture of two or more of the above gases.

29. The method of claim 22, wherein a deposition metal layer having a desired thickness is formed by repeating the steps (b) of forming the sacrificial metal layer and the step (c) of replacing the sacrificial metal layer with the deposition metal layer.

30. The method of claim 22, wherein a deposition metal layer having a desired thickness is formed by repeating the step of forming the sacrificial metal layer, of supplying a purge gas, of replacing the sacrificial metal layer with the deposition metal layer, and of supplying a purge gas.

31. A method of forming a selective metal layer on a semiconductor substrate, the method comprising the steps of:

forming a conductive layer on the substrate;

forming an insulative layer over the conductive layer;

etching a portion of the insulative layer and exposing a portion of the conductive layer;

selectively forming an aluminum layer on the exposed portion of the conductive layer by exposing the exposed portion of the conductive layer and the insulative layer to a sacrificial metal source gas containing aluminum;

selectively depositing a sacrificial aluminum layer on the conductive layer; and replacing the sacrificial aluminum layer with a deposition metal layer by supplying a metal halide gas having a halogen coherence smaller than the halogen coherence of metal atoms in the sacrificial metal layer.

32. A method of forming a selective metal layer on a semiconductor substrate, the method comprising the steps of:

forming a conductive layer on the substrate;

forming an insulative layer over the conductive layer;

etching a portion of the insulative layer and exposing a portion of the conductive layer;

selectively forming a sacrificial metal layer on the exposed portion of the conductive layer by exposing the exposed portion of the conductive layer and the insulative layer to a sacrificial metal source gas containing aluminum;

selectively depositing a sacrificial aluminum layer on the conductive layer; and replacing the sacrificial aluminum layer with a deposition metal layer by supplying a metal halide gas having a halogen coherence smaller than the halogen coherence of metal atoms in the sacrificial metal layer.

* * * * *

UNITED STATES PATENT AND TRADEMARK OFFICE
CERTIFICATE OF CORRECTION

PATENT NO. : 6,372,598 B2
DATED : April 16, 2002
INVENTOR(S) : Kang et al.

It is certified that error appears in the above-identified patent and that said Letters Patent is hereby corrected as shown below:

Column 2,
Line 6, "capacotor" should read -- capacitor --.

Column 5,
Lines 8-9, "(alr03,Srlr03,Balr03" should read -- (aIr03, SrIr03, BaIr03 --.

Column 6,
Line 29, "Mol2" should read -- MoI2 --.

Column 17,
Line 26, "(b)" should read -- (c) --.
Line 27, "(c)" should read -- (d) --.

Signed and Sealed this

Fifth Day of November, 2002

Attest:

JAMES E. ROGAN
Attesting Officer　　Director of the United States Patent and Trademark Office